(12) United States Patent
Abe (10) Patent No.: US 6,930,317 B2
(45) Date of Patent: Aug. 16, 2005

(54) CHARGED PARTICLE BEAM APPARATUS, CHARGED PARTICLE BEAM IRRADIATION METHOD, AND METHOD OF MANUFACTURING SEMICONDUCTOR DEVICE

(75) Inventor: Hideaki Abe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 10/742,998

(22) Filed: Dec. 23, 2003

(65) Prior Publication Data

US 2004/0211925 A1 Oct. 28, 2004

(30) Foreign Application Priority Data

Dec. 25, 2002 (JP) ...................................... 2002-374488

(51) Int. Cl.$^7$ ............................................ H01J 37/304
(52) U.S. Cl. .................. 250/492.22; 250/311; 250/310; 356/401; 356/124; 355/53
(58) Field of Search ........................... 250/492.22, 311, 250/310; 356/401, 124; 355/53

(56) References Cited

FOREIGN PATENT DOCUMENTS

| JP | 2-139844 | 5/1990 |
|----|----------|--------|
| JP | 05-151921 | 6/1993 |
| JP | 6-124681 | 5/1994 |
| JP | 2002-006479 | 1/2002 |

OTHER PUBLICATIONS

Notification of Reason for Rejection, issued by Japanese Patent Office, mailed Feb. 25, 2005, in Japanese Patent Application No. 2002-374488, and English-language translation thereof.

*Primary Examiner*—Nikita Wells
*Assistant Examiner*—Zia R. Hashmi
(74) *Attorney, Agent, or Firm*—Finnegan, Henderson, Farabow, Garrett & Dunner, L.L.P.

(57) ABSTRACT

A charged particle beam apparatus includes: a charged particle beam source which generates a charged particle beam to be incident on a specimen, the specimen having a pattern on a surface thereof; an edge position detector which detects an edge position of the pattern from shape information of the pattern; an irradiation region setter which sets an irradiation region in the specimen to be irradiated with a charged particle beam to an edge of the pattern and a region in the vicinity of the edge; an irradiation position information provider which successively outputs an irradiation position information signal designating an irradiation position of the charged particle beam in the surface of the specimen scanned by the charged particle beam, while avoiding successive designation of irradiation positions in the irradiation region which are adjacent to each other; and an irradiation controller which controls the charged particle beam generated by the charged particle beam source so that the irradiation position corresponding to the outputted irradiation position information signal is irradiated with the charged particle beam.

20 Claims, 8 Drawing Sheets

CHARGED PARTICLE BEAM APPARATUS, CHARGED PARTICLE BEAM IRRADIATION METHOD, AND METHOD OF MANUFACTURING SEMICONDUCTOR DEVICE

CROSS REFERENCE TO RELATED APPLICATION

This application claims benefit of priority under 35USC §119 to Japanese Patent Application No. 2002-374488, filed on Dec. 25, 2002, the contents of which are incorporated by reference herein.

BACKGROUND OF THE INVENTION

1. Field of the Invention

The present invention relates to a charged particle beam apparatus, a charged particle beam irradiation method, and a method of manufacturing a semiconductor device.

More specifically, the present invention relates to a charged particle beam apparatus to, for example, scan a specimen with a charged particle beam, with a position on the specimen to be irradiated being beforehand designated, to a charged particle beam irradiation method, and to a method of manufacturing a semiconductor device which includes, for example, measuring the specimen with the use of the irradiation method.

2. Related Background Art

When a charged particle beam irradiation apparatus such as a scanning electron microscope (SEM) is used to observe a specimen, raster scanning is performed while controlling a trajectory of an electron beam from an electron gun using a scanning deflector. A secondary electron or a reflected electron generated from the surface layer of the specimen by irradiation with the electron beam is detected to acquire an image of the surface of the specimen from the detected signal. Characteristics of the raster scanning lie in that an irradiation position of the electron beam continuously moves in one direction.

However, when portions having concave/convex shapes and differences in materials in an LSI pattern are scanned with the electron beams, a phenomenon called as charge-up occurs in the specimen depending on the pattern shape or the scanning direction of the electron beams, and contrast sometimes fluctuates in an image due to the charge-up. Furthermore, sometimes a difference occurs in contrast or image resolution between an edge portion having an edge crossing at right angles to the scanning direction of the electron beams and an edge portion having an edge extending in parallel with the direction of the electron beams.

Regarding a conventional line pattern, its image is acquired in such a manner that the scanning direction of the electron beams crosses at right angles to the edge of the pattern. Therefore, the contrast or resolution of the edge portion does not especially raise any problem. However, in recent years, sufficient shape evaluation and process management have been impossible only with one-dimensional measurement of line patterns because of integration and complication of the LSI pattern. Therefore, evaluation of two-dimensional shape has been executed with the use of two-dimensional image information obtained by the raster scanning.

However, as described above, the raster scanning sometimes still causes contrast fluctuations depending on the pattern shape or- the scanning direction, and changes of the resolution by the direction of the edge. Therefore, when the shape is two-dimensionally measured from the image obtained by the raster scanning, measurement results including an influence of the scanning direction are outputted. In order to obtain an image from which the influence of the scanning direction is removed, there are required scanning methods other than the raster scanning.

Examples of a scanning method involving little influence of the scanning direction include random scanning disclosed, for example, in Japanese Patent Application Laid-Open (kokai) No. 5-151921. The invention of the Japanese Patent Application Laid-Open No. 5-151921 is characterized in that an irradiation position information signal designating an electron beam irradiation position in a scanning plane scanned by the electron beam is successively outputted so that the irradiation positions are designated at random to each other, and the irradiation position corresponding to the outputted irradiation position information signal is sequentially irradiated with the electron beams.

However, when a whole irradiation region is scanned with the electron beams at random, a very long time is required to obtain the image for the measurement depending on the magnification of the measurement. Furthermore, there has been a problem that a sufficient S/N cannot be secured due to the discrete beam irradiation as compared with the continuous beam irradiation in the raster scanning.

BRIEF SUMMARY OF THE INVENTION

According to a first aspect of the present invention, there is provided a charged particle beam apparatus comprising:

a charged particle beam source which generates a charged particle beam to be incident on a specimen, the specimen having a pattern on a surface thereof;

an edge position detector which detects an edge position of the pattern from shape information of the pattern;

an irradiation region setter which sets an irradiation region in the specimen to be irradiated with a charged particle beam to an edge of the pattern and a region in the vicinity of the edge;

an irradiation position information provider which successively outputs an irradiation position information signal designating an irradiation position of the charged particle beam in the surface of the specimen scanned by the charged particle beam, while avoiding successive designation of irradiation positions in the irradiation region which are adjacent to each other; and an irradiation controller which controls the charged particle beam generated by the charged particle beam source so that the irradiation position corresponding to the outputted irradiation position information signal is irradiated with the charged particle beam.

According to a second aspect of the present invention, there is provided a charged particle beam apparatus comprising:

a charged particle beam source which generates a charged particle beam to be incident on a specimen, the specimen having a pattern on a surface thereof;

an edge position detector which detects an edge position of the pattern from shape information of the pattern;

an irradiation region setter which sets an irradiation region to be irradiated with a charged particle beam to an edge of the pattern and a region on the surface of the specimen in the vicinity of the edge;

an irradiation position information provider which successively outputs an irradiation position information signal designating an irradiation position so that a plurality of serial pixels on the surface of the specimen to be scanned is irradiated with the charged particle beam, with the last pixel of the plurality of serial pixels being prevented from being disposed adjacent to the first pixel of serial pixels to be next irradiated with the charged particle beam; and an irradiation controller which controls the charged particle beam so that the irradiation position corresponding to the outputted irradiation position information signal is irradiated with the charged particle beam.

According to a third aspect of the present invention, there is provided a charged particle beam irradiation method comprising:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position of the charged particle beam in the surface of the specimen to be scanned by the charged particle beam, while avoiding successive designation of irradiation positions in the irradiation region which are adjacent to each other; and irradiating the irradiation position corresponding to the outputted irradiation position information signal with the charged particle beam.

According to a fourth aspect of the present invention, there is provided a charged particle beam irradiation method comprising:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position so as to irradiate a plurality of serial pixels on the surface of the specimen to be scanned, while preventing the last pixel of the plurality of serial pixels from being disposed adjacent to the first pixel of serial pixels to be next irradiated with the charged particle beam; and irradiating the irradiation position corresponding to the outputted irradiation position information signal with the charged particle beam.

According to a fifth aspect of the present invention, there is provided a method of manufacturing a semiconductor device comprising using a charged particle beam irradiation method, the charged particle beam irradiation method including:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position of the charged particle beam in the surface of the specimen to be scanned by the charged particle beam, while avoiding successive designation of irradiation positions in the irradiation region which are adjacent to each other; and irradiating the irradiation position corresponding to the outputted irradiation position information signal with the charged particle beam.

According to a sixth aspect of the present invention, there is provided a method of manufacturing a semiconductor device comprising using a charged particle beam irradiation method, the charged particle beam irradiation method including:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position so as to irradiate a plurality of serial pixels on the surface of the specimen to be scanned, while preventing the last pixel of the plurality of serial pixels from being disposed adjacent to the first pixel of serial pixels to be next irradiated with the charged particle beam; and irradiating the irradiation position corresponding to the outputted irradiation position information signal with the charged particle beam.

DETAILED DESCRIPTION OF THE INVENTION

Several embodiments of the present invention will be described with reference to the drawings. It is to be noted that embodiments in which electron beams are used as examples of charged particle beams will hereinafter be described, but the present invention is not limited to such beams, and can, needless to say, be applied also to an ion beam as the charged particle beam.

(1) First Embodiment

Figure 1:
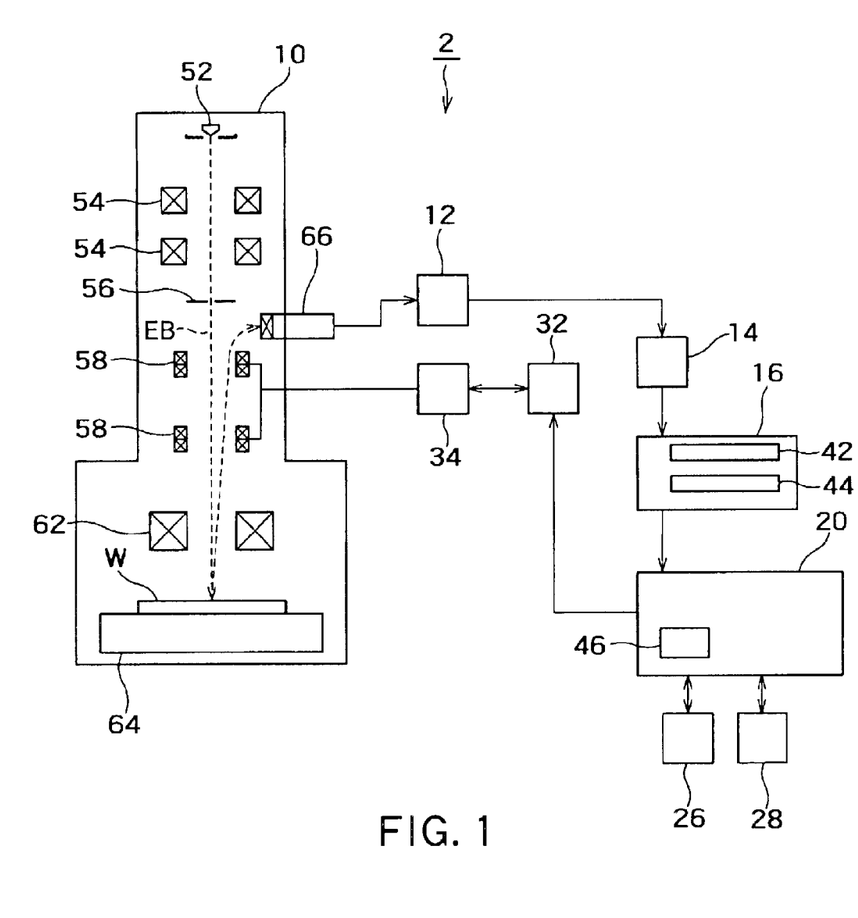
FIG. 1 is a block diagram showing a schematic constitution of a first embodiment of a charged particle beam apparatus according to the present invention.

FIG. 1 is a block diagram showing a schematic constitution of a first embodiment of a charged particle beam apparatus according to the present invention. An electron beam apparatus 2 comprises a column 10, an image converter 12, an image memory 14, an image processor 16, a main computer 20, an edge position memory 26, a memory for beam deflection 28, a beam shift controller 32, and a scanning deflection controller 34.

The image processor 16 includes an edge position detector 42 and irradiation region setter 44. The main computer 20 includes a random number generator 46. The main computer 20 controls the whole electron beam apparatus 2 and outputs irradiation position information as described later.

The column 10 includes an electron gun 52, condenser lenses 54, an aperture 56, scanning deflectors 58, objective lenses 62, a stage 64, and a detector 66. The scanning deflector 58 includes a deflector for horizontal scanning and a deflector for vertical scanning. A wafer W having a pattern (not shown) to be observed or measured which is formed on the upper surface of the wafer is mounted on the upper surface of the stage 64. The electron gun 52 generates an electron beam EB, and this electron beam EB travels through the condenser lenses 54, the aperture 56, the scanning deflectors 58, and objective lenses 62 to reach the pattern on the upper surface of the wafer W.

Next, an operation of the electron beam apparatus 2 shown in FIG. 1 will hereinafter be described as an embodiment of a charged particle beam irradiation method according to the present invention.

Figure 2:
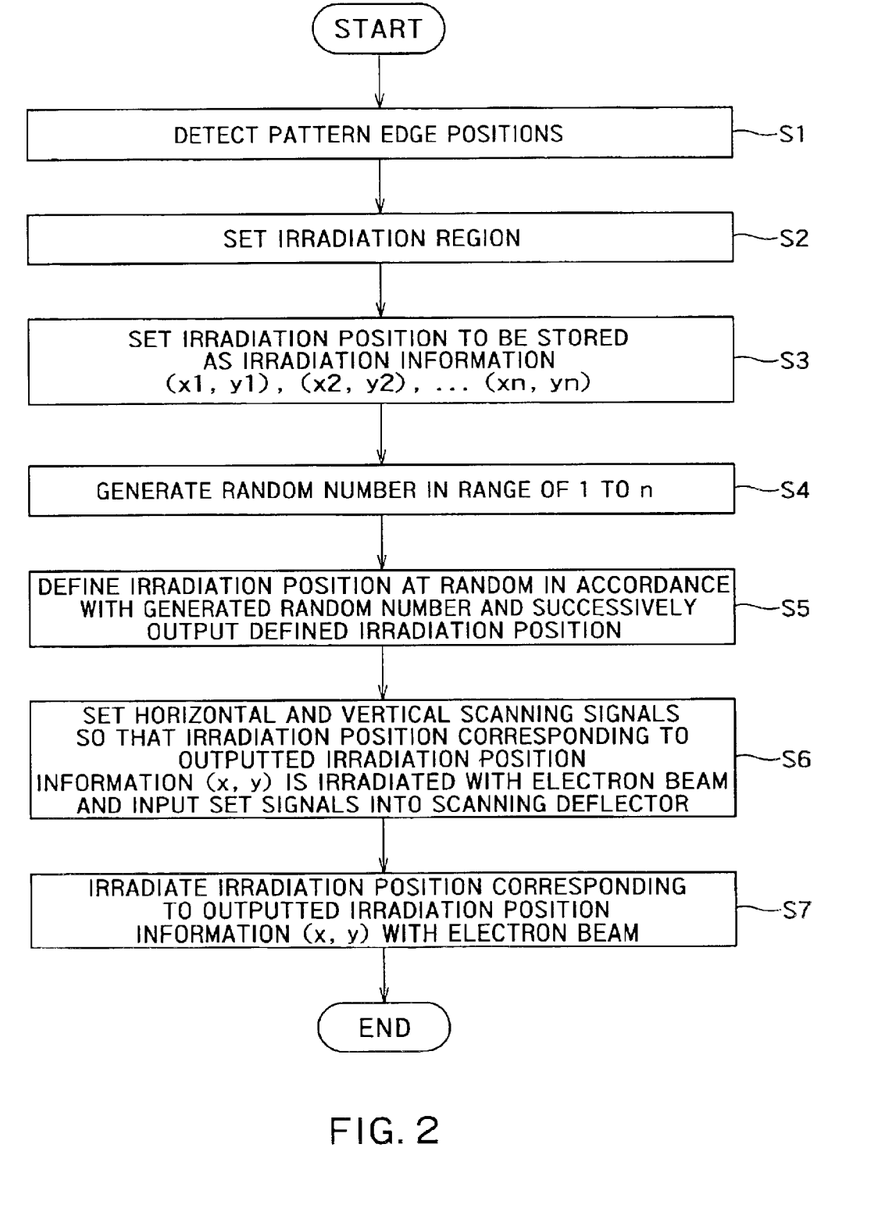
FIG. 2 is a flowchart showing a schematic procedure of a first embodiment of a charged particle beam irradiation method according to the present invention.

FIG. 2 is a flowchart showing a schematic procedure of the charged particle beam irradiation method of the present embodiment.

First, the edge positions of the pattern to be observed or measured are detected (step S1). Specifically, the electron beam EB is generated by the electron gun 52 in the column 10, a position of the upper surface of the wafer W where the pattern is disposed is irradiated with the electron beam by the raster scanning using the scanning deflectors 58 or the scanning deflectors 58 and the stage 64, and secondary electrons, reflected electrons and back scattered electrons (hereinafter referred to as the secondary electrons and the like) generated from the pattern and the peripheral portion thereof are detected by the detector 66. An analog signal from the detected secondary electrons and the like is supplied to the image converter 12 and converted to a digital signal, and then is stored as image data of the pattern and the peripheral portion thereof in the image memory 14. Thus, this image data includes shape information of the pattern on the specimen.

The image data is drawn from the image memory 14 by the image processor 16, and the edge position detector 42 searches and detects the pattern edge position by image processing. In general, an image processing to detect a pattern edge includes, for examples, a binarize process, contour extraction process and the like, but another pattern edge detection algorithm may be used to detect the pattern edge.

The information of the detected pattern edge position is stored in the edge position memory 26 via the main computer 20. For example, when one frame is composed of (512, 512) pixels, numerals in a range of x=1 to 512, y=1 to 512 are allotted to edge positions (x, y).

Figure 3A:
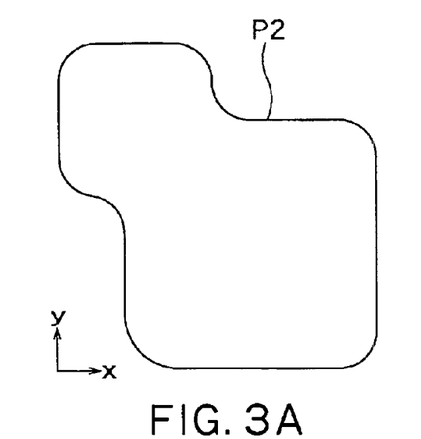
FIGS. 3A to 3C are explanatory views showing an example of a method of setting an irradiation region of electron beams.
Figure 3B:
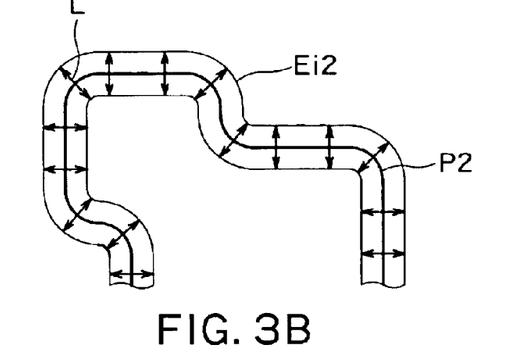
Figure 3C:
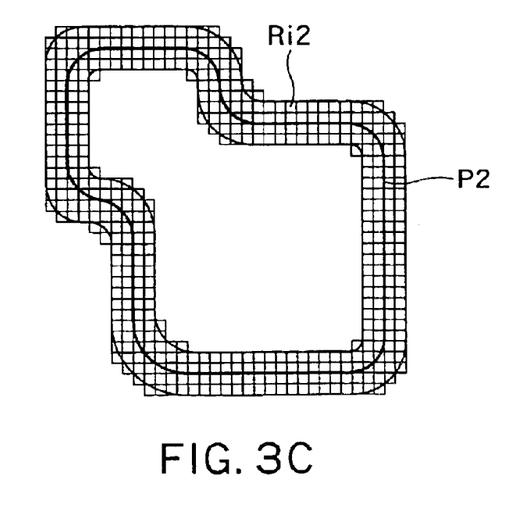

Next, the irradiation region setter 44 of the image processor 16 sets an irradiation region to be irradiated with the electron beams in the vicinity of the pattern edge position, using the pattern edge position information detected by the above-described procedure (step S2). An example of a method of setting the irradiation region will be described with reference to FIGS. 3A through 4B. In the method shown in FIGS. 3A to 3C, with respect to a certain pattern P2 (FIG. 3A) in which the edge position is detected, a position distant from the pattern edge positions by a preset distance are defined as that constituting an irradiation region end Ei2 (FIG. 3B) with the use of a straight line crossing at right angles to tangent lines of edge positions (xi, yi), and the inside of this irradiation region end Ei2 is set as an irradiation region Ri2 (FIG. 3C). Pixels in the irradiation region Ri2 set in this manner, that is, the irradiation positions are successively stored in the memory for beam deflection 28 by the main computer 20 (FIG. 2, step S3). For example, assuming that the number of irradiation points is n, data such as (x1, y1) to (xn, yn) are allotted in the memory for beam deflection 28.

Figure 4A:
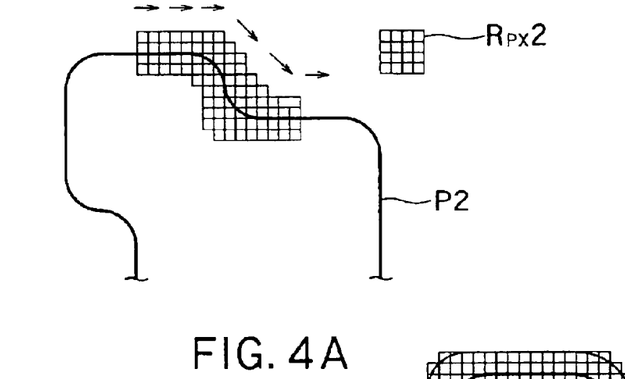
FIGS. 4A and 4B are explanatory views showing another example of the method of setting the irradiation region of the electron beams.
Figure 4B:
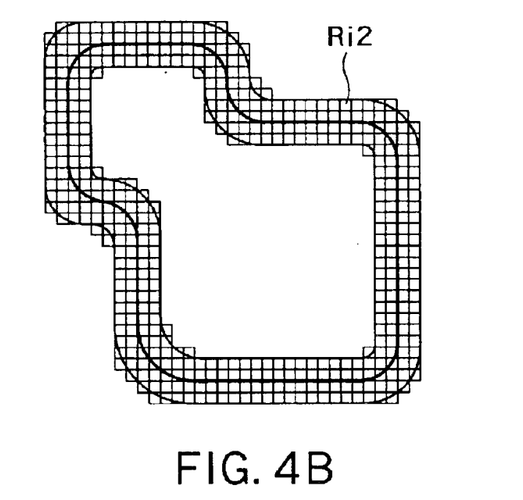

Moreover, in the method shown in FIGS. 4A and 4B, a pixel region $R_{PX}2$ having a predetermined shape and size is set beforehand, a center of this pixel region $R_{PX}2$ is applied to each pattern edge position (FIG. 4A), and a region composed of the applied pixel regions $R_{PX}2$ is set as the irradiation region Ri2 (FIG. 4B). In FIG. 4A, 4×4 rectangular regions $R_{PX}2$ are used and applied to the pattern edge positions, but the shape and size of the pixel region $R_{PX}2$ can be set in accordance with purposes of measurement or observation every time. In the methods shown in FIGS. 3A to 4B, the irradiation region Ri2 is constituted of the region having a certain width kept from the pattern edge position, but the width of the irradiation region is not limited to a particular width. For example, when a pattern shape includes many corners and is complicated, or is simple like a straight line, the beam irradiation can be optimized by using an irradiation region setting method in which the irradiation region is adjusted in accordance with the shape of the targeted pattern.

Next, the irradiation position information stored in the memory for beam deflection 28 is outputted at random so that the irradiation position is designated at random. The random number generator 46 of the main computer 20 generates random numbers 1 to n (step S4), the main computer 20 associates the generated random numbers with the addresses of the irradiation position information in the memory for beam deflection 28, and the associated irradiation position information (x, y) is successively supplied to the beam shift controller 32.

Figure 5:
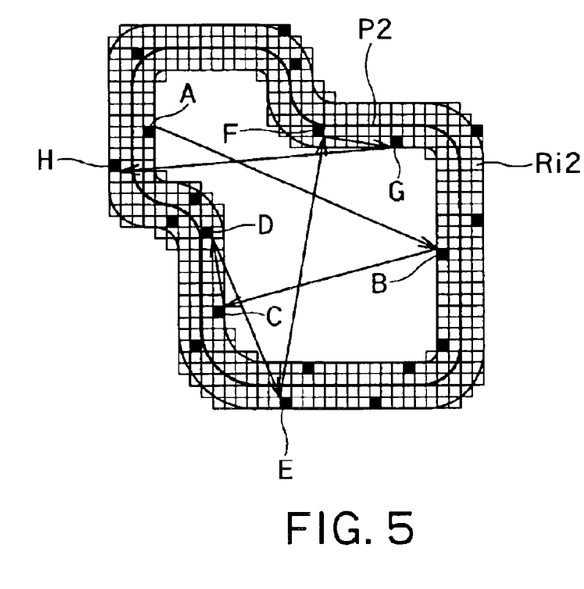
FIG. 5 is an explanatory view showing a sequence of random irradiation with charged particle beams by the procedure shown in FIG. 2.

The beam shift controller 32 sets a horizontal scanning signal and a vertical scanning signal to supply the signals to the scanning deflection controller 34 so as to irradiate the irradiation position corresponding to the supplied irradiation position information (x, y) with the electron beams. The scanning deflection controller 34 generates a deflection voltage corresponding to the irradiation position information (x, y) for the respective supplied horizontal and vertical scanning signals to apply the voltage to the scanning deflector 58 (step S6). Accordingly, the scanning deflector 58 deflects the electron beams so that the predetermined irradiation position corresponding to the irradiation position information (x, y) is irradiated with the electron beams (step S7). FIG. 5 shows a part of an example of partial raster scanning by this method. As shown in the figure, the irradiation positions A to H which are not disposed adjacent to one another are irradiated with the electron beam EB like A→B→C→D→E→F→G→H in the irradiation region Ri2 set so as to form a stripe shape around the edge of a pattern P2.

According to the present embodiment, the irradiation region of the charged particle beam is thus set to the edge of the pattern and its peripheral region, and the charged particle beam is then scanned at random in the irradiation region. Therefore, charge-up of the specimen by the irradiation with the charged particle beam can be suppressed, and asymmetry of the image due to influences of the pattern shape and scanning direction can be restrained. Accordingly, reliability of the pattern edge position and sharpness of the pattern edge are enhanced, so that the reliability of the image for use in measuring the pattern shape is largely enhanced. Moreover, when only the pattern edge and its peripheral region are scanned at random, it is possible to largely reduce a time of the random scanning. As an example, a case is considered in which a rectangular pattern of 300×300 pixels is disposed in an image region of 512×512 pixels. When total surface random scanning is performed, the irradiation region corresponds to 512×512=262 k pixels$^2$. However, for the random scanning of the present embodiment, when an irradiation width is set to 50 pixels, the irradiation region is reduced to 50 k pixels$^2$, and the image is completely taken in about ⅕ of the irradiation time. As a result, the present invention can also be applied even to applications in which both measurement precision and saving of time have heretofore been required, such as the measurement of the pattern shape.

It is to be noted that blanking is required for the random irradiation with the electron beam EB. Therefore, a blanking time is set as a time required for moving the electron beam EB, and a position other than the irradiation position is prevented from being irradiated with the electron beam EB. An irradiation time per one irradiation in the irradiation position is also set with the blanking time.

Moreover, when a frame is taken a plurality of times in order to secure S/N of the image, the random number generator 46 generates the random number again at the time of completion of the irradiation of n portions with the beams, and an irradiation order may also be changed every time the frame is taken in. Moreover, the random number generated for the first time may constantly be used to take the frame.

Furthermore, even when there are a large number of patterns to be observed or measured but the patterns include those of the same shape, and when the patterns of the same shape are measured, an order of irradiation may be stored beforehand in a memory (not shown), and be withdrawn from the memory instead of generating the random number for every beam irradiation.

There has been described heretofore an embodiment in which the pattern edge position is calculated from the pattern shape to irradiate only the pattern edge and the region in the vicinity thereof, but the present invention is never limited to the embodiment. The whole region of the pattern defined by the pattern edge may also be set as an irradiation region to be irradiated with the electron beam EB.

Figure 6A:
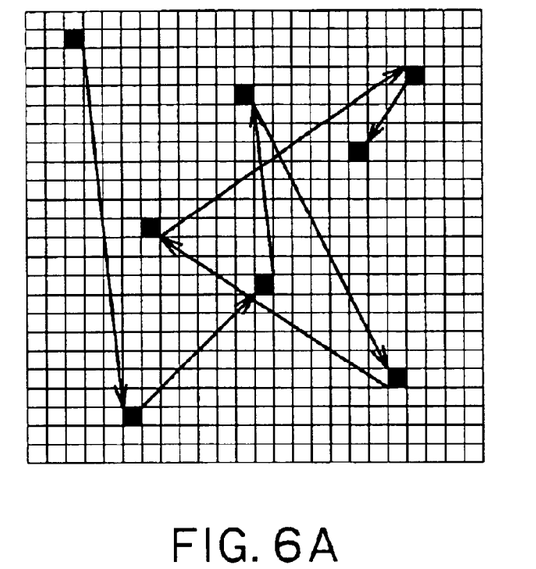
FIG. 6A is an explanatory view showing a method of setting the irradiation position for each pixel.
Figure 6B:
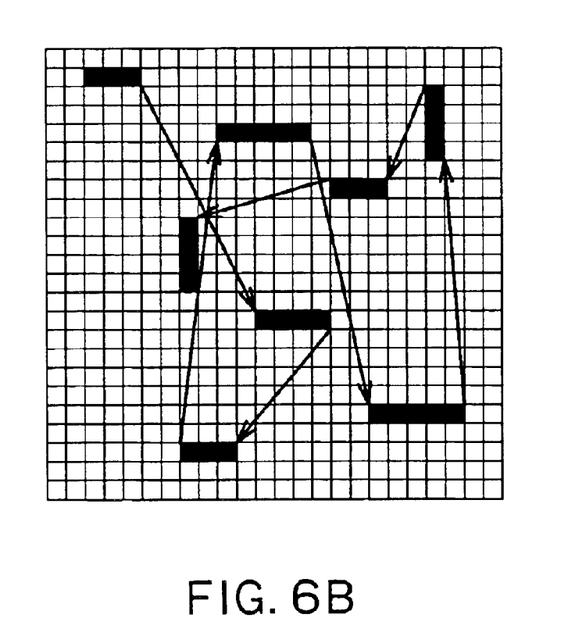
FIG. 6B is an explanatory view showing an example of a method of setting a plurality of pixels disposed adjacent to one another as irradiation positions.

Moreover, in the description, the method of outputting the irradiation position information completely at random has been described. However, it is also possible to set the irradiation position of several serial pixels other than setting the irradiation position for each pixel. FIG. 6B shows designation of irradiation positions where a plurality of pixels are disposed adjacent to one another in comparison with FIG. 6A showing setting of the positions for each pixel. The number of successive pixels is thus set separately in x and y directions in accordance with the shape or a degree of complication of the pattern, so that an effect that irradiation efficiency is largely enhanced is obtained.

(2) Second Embodiment

Figure 7:
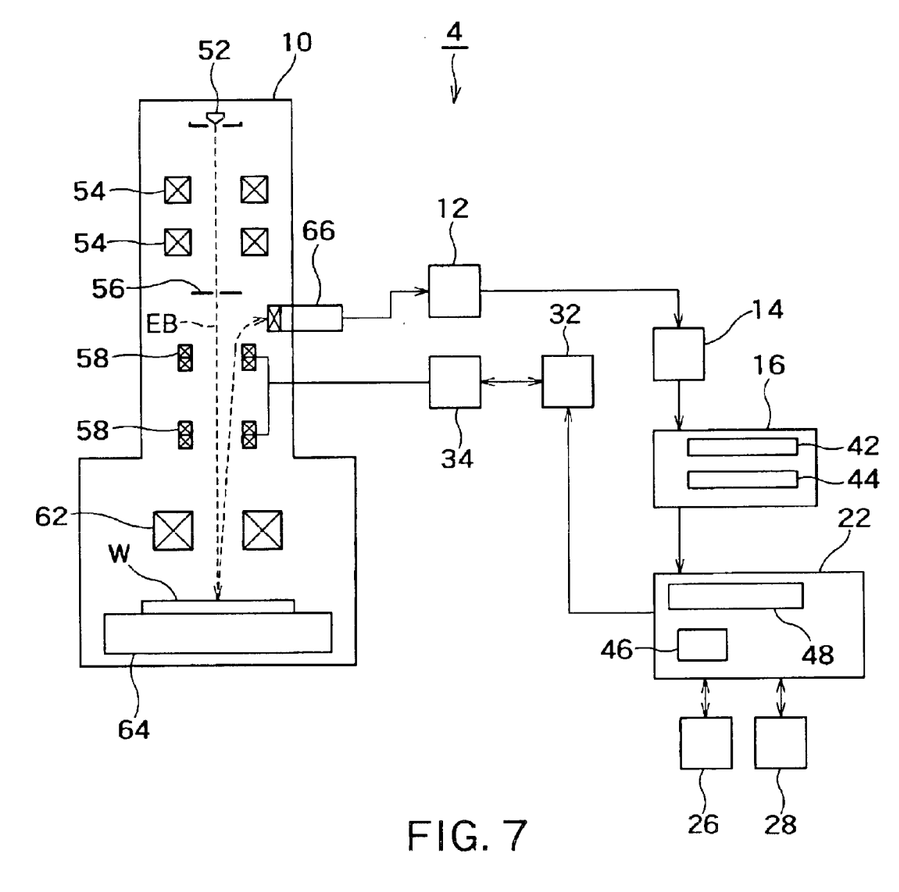
FIG. 7 is a block diagram showing a schematic constitution of a second embodiment of a charged particle beam apparatus according to the present invention.

FIG. 7 is a block diagram showing a schematic constitution of a second embodiment of a charged particle beam apparatus according to the present invention. The characteristics of an electron beam apparatus 4 shown in the figure lie in that a main computer 22 includes a pattern shape evaluator 48 in addition to the random number generator 46. The pattern shape evaluator 48 receives the pattern edge position information from the image processor 16 to evaluate the degree of complication of the pattern shape. The other constitution of the electron beam apparatus 4 is substantially the same as that of the electron beam apparatus 2 shown in FIG. 1.

In measuring a pattern shape or the like, if S/N is insufficient in a corner or curved portion of the pattern or in a hole shape, an insufficient measurement precision is sometimes obtained. On the other hand, with regard to a simple shape such as that of a straight line, the edge positions are easily detected, and therefore the measurement precision can be secured even when the S/N is not very high. As described above, the S/N required in the measurement differs with a local pattern shape.

Therefore, in the present embodiment, the pattern shape evaluator 48 provided in the main computer 22 is used to evaluate the complication of the local pattern shape from the pattern edge position information, and the edge position information of the complicated portion is outputted. The main computer 22 sets the number of times of random irradiations to a plurality of times, or executes a control to lengthen an irradiation time for the irradiation positions (x, y). corresponding to the complicated portion of the pattern obtained by the pattern shape evaluator 48. Accordingly, the amount of detected signals increases and an image having a high S/N can be obtained. Examples of the method of evaluating the degree of complication of the pattern include: a method of calculating an angle of a line segment composed of pattern edge coordinates (xi, yi) included in pattern shape information obtained by the raster scanning of the region where the pattern is formed on the wafer W with the electron beam EB, and of a line segment composed of adjacent pattern edge coordinates (xi+1, yi+1); a method of calculating $\tan^{-1}\{(yi+1-yi)/(xi+1-yi)\}$; a method of obtaining an angle fluctuation in a certain interval as the degree of complication; and the like. Additionally, it is also possible to use an angle fluctuation when an angle of a line segment between (i+1) and (i) and another line between (i) and (i−1) fluctuates in a certain interval instead of using an angle of line segments.

It is to be noted that in the present embodiment, the pattern shape evaluator 48 is arranged in the main computer 22, but may alternatively be arranged in the image processor 16.

(3) Third Embodiment

Figure 8:
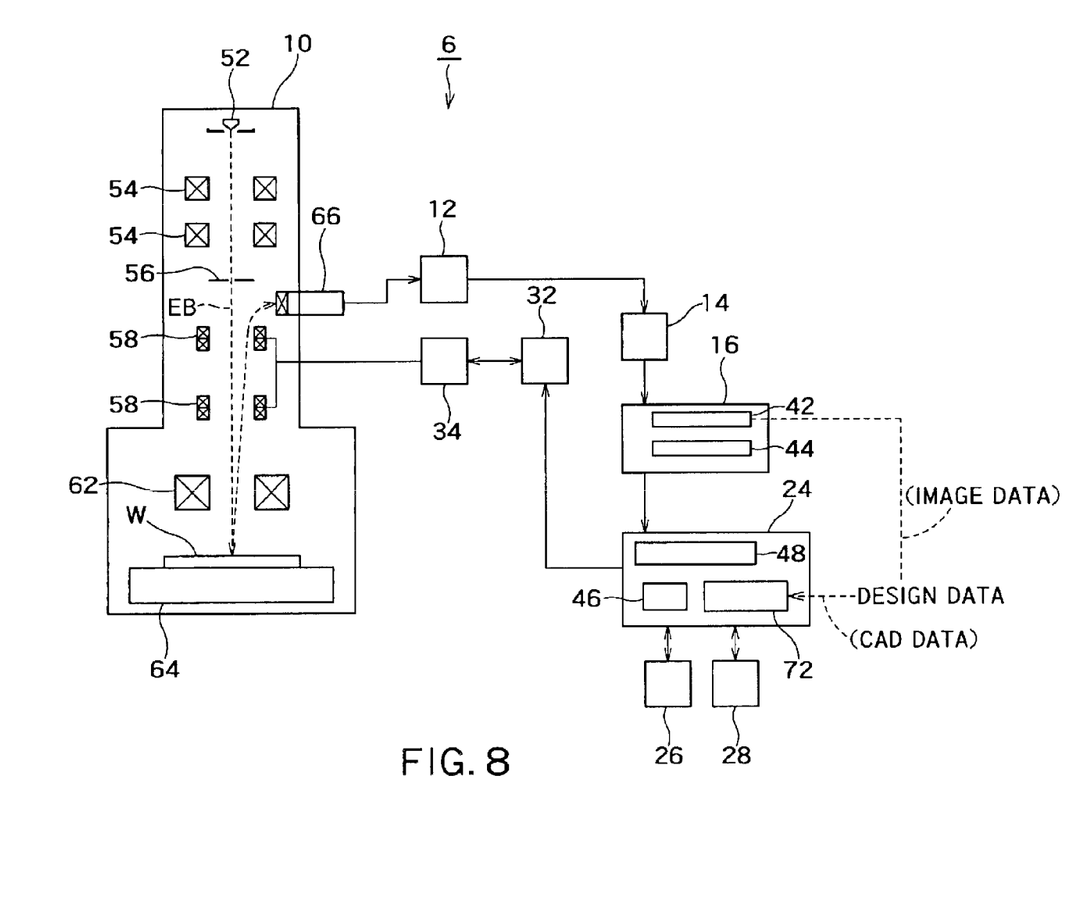
FIG. 8 is a block diagram showing the schematic constitution of a third embodiment of a charged particle beam apparatus according to the present invention.

FIG. 8 is a block diagram showing the schematic constitution of a third embodiment of a charged particle beam apparatus according to the present invention. The characteristics of an electron beam apparatus 6 shown in the figure lie in that a main computer 24 further includes a design data converter 72 in addition to the pattern shape evaluator 48 and the random number generator 46. The other constitution of the electron beam apparatus 6 is substantially the same as that of the electron beam apparatus 2 shown in FIG. 1.

In the first embodiment, image data obtained by the raster scanning is used in order to detect the pattern edge position.

Figure 9:
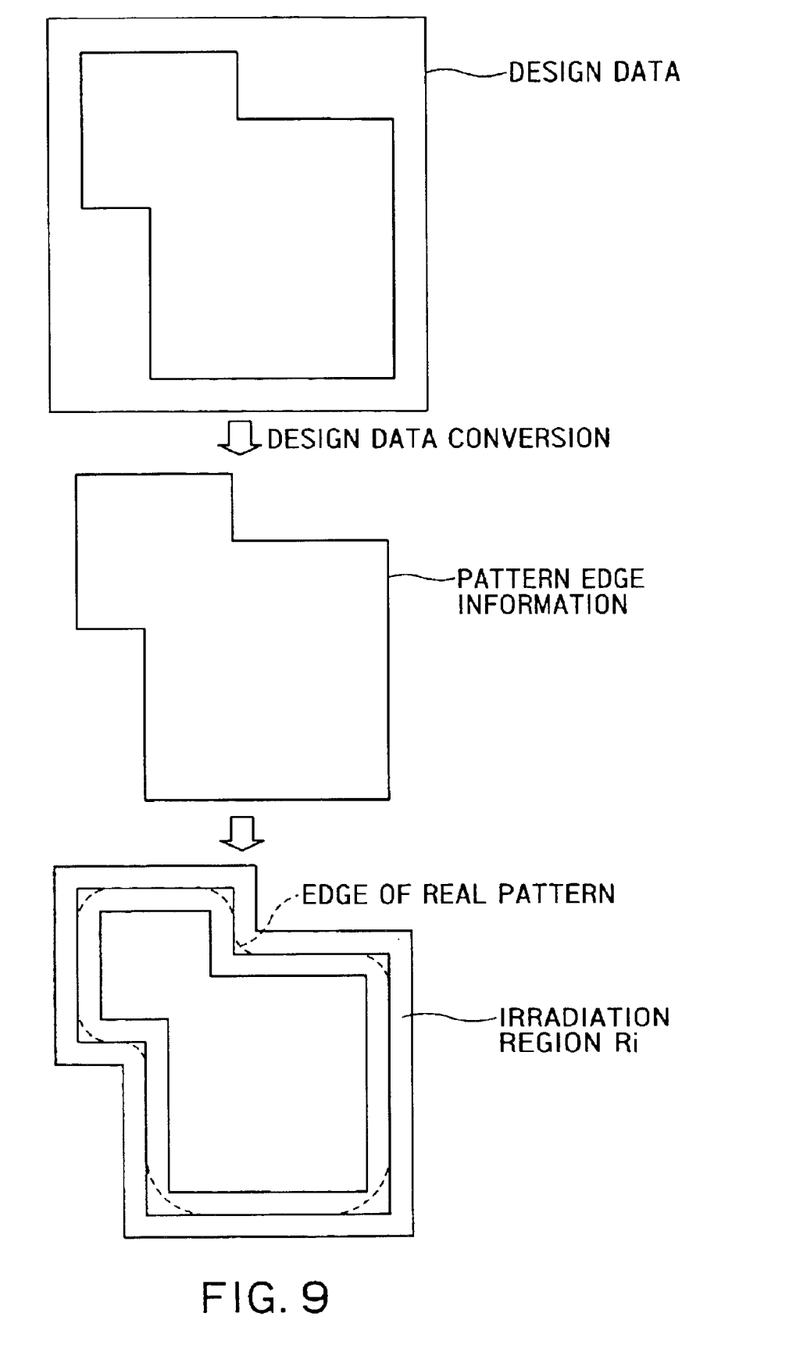
FIG. 9 is an explanatory view of a third embodiment of a charged particle beam irradiation method according to the present invention.

However, in the present embodiment, the design data converter 72 takes in design data of the pattern such as CAD data to detect the edge position of the pattern beforehand. FIG. 9 is an explanatory view of a procedure from incorporating of the design data to setting of the irradiation region. Specifically, after taking in the design data, the design data converter 72 of the main computer 24 acquires the pattern edge information by a predetermined data conversion process to supply the information to the irradiation region setter 44 of the image processor 16. The irradiation region setter 44 sets the irradiation region Ri by the image processing described above in the first embodiment. When the design data includes pattern edge position information in this manner, the design data converter 72 acquires the pattern edge information. Alternatively, when the design data is the image data itself, the edge position detector 42 of the image processor 16 takes the data in to acquire the position information of the pattern edge in the same manner as in the first embodiment. In accordance with the present embodiment, since the edge position information of the pattern is acquired from the design data, it is possible to designate the irradiation position of the electron beam without executing the raster scanning of the pattern.

(4) Method of Manufacturing the Semiconductor Device

When a charged particle beam irradiation method of the above-described first to third embodiments is applied to the measurement of a semiconductor device, the image of the semiconductor device to be measured can be acquired with high precision in a short time. Accordingly, it is possible to manufacture the semiconductor device with high throughput and yield.

What is claimed is:

1. A charged particle beam apparatus comprising:
   a charged particle beam source which generates a charged particle beam to be incident on a specimen, the specimen having a pattern on a surface thereof;
   an edge position detector which detects an edge position of the pattern from shape information of the pattern;
   an irradiation region setter which sets an irradiation region in the specimen to be irradiated with a charged particle beam to an edge of the pattern and a region in the vicinity of the edge;
   an irradiation position information provider which successively outputs an irradiation position information signal designating an irradiation position of the charged particle beam in the surface of the specimen scanned by the charged particle beam, while avoiding successive designation of irradiation positions in the irradiation region which are adjacent to each other; and
   an irradiation controller which controls the charged particle beam generated by the charged particle beam source so that the irradiation position corresponding to the outputted irradiation position information signal is irradiated with the charged particle beam.

2. The charged particle beam apparatus according to claim 1,
   wherein the irradiation position information provider outputs information of the irradiation position at random.

3. The charged particle beam apparatus according to claim 2,
   wherein said irradiation position information provider includes a random number generator and outputs the irradiation position information at random in accordance with a random number generated by the random number generator.

4. The charged particle beam apparatus according to claim 1,
   wherein the irradiation region is a strip-shaped region having a width the center of which coincides with the edge position of the pattern.

5. The charged particle beam apparatus according to claim 1,
   wherein at least one of a shape and size of the irradiation region is set for each edge point of the pattern in accordance with a local shape of the edge of the pattern.

6. The charged particle beam apparatus according to claim 1,
   wherein the pattern shape information is information of an image obtained by irradiating the pattern with the charged particle beam, and
   said edge position detector uses the obtained image to detect the edge position of the pattern.

7. The charged particle beam apparatus according to claim 1,
   wherein the pattern shape information is design information of the pattern, and
   said edge position detector uses the design information to detect the edge position of the pattern.

8. The charged particle beam apparatus according to claim 1,
   wherein the irradiation position information signal is arranged in accordance with an outputted order.

9. A charged particle beam apparatus comprising:
   a charged particle beam source which generates a charged particle beam to be incident on a specimen, the specimen having a pattern on a surface thereof;
   an edge position detector which detects an edge position of the pattern from shape information of the pattern;
   an irradiation region setter which sets an irradiation region to be irradiated with a charged particle beam to an edge of the pattern and a region on the surface of the specimen in the vicinity of the edge;
   an irradiation position information provider which successively outputs an irradiation position information signal designating an irradiation position so that a plurality of serial pixels on the surface of the specimen to be scanned is irradiated with the charged particle beam, with the last pixel of the plurality of serial pixels being prevented from being disposed adjacent to the first pixel of serial pixels to be next irradiated with the charged particle beam; and
   an irradiation controller which controls the charged particle beam so that the irradiation position corresponding to the outputted irradiation position information signal is irradiated with the charged particle beam.

10. The charged particle beam apparatus according to claim 9,
    wherein said irradiation position information provider outputs irradiation position information for the serial pixels at random.

11. A charged particle beam irradiation method comprising:
    detecting an edge position of a pattern formed on a surface of a specimen from shape information of the pattern;
    setting an irradiation region which is a region to be irradiated with a charged particle beam to an edge of the pattern and a region on the surface of the specimen in the vicinity of the edge;
    successively outputting an irradiation position information signal designating an irradiation position of the charged particle beam in the surface of the specimen to be scanned by the charged particle beam, while avoiding successive designation of irradiation positions in the irradiation region which are adjacent to each other; and irradiating the irradiation position corresponding to the outputted irradiation position information signal with the charged particle beam.

12. The charged particle beam irradiation method according to claim 11, wherein the irradiation position information is outputted at random.

13. The charged particle beam irradiation method according to claim 11, wherein the irradiation position information is outputted at random in accordance with a random number.

14. The charged particle beam apparatus according to claim 11, wherein at least one of a shape and size of the irradiation region is set for each edge point of the pattern in accordance with a local shape of the edge of the pattern.

15. The charged particle beam apparatus according to claim 11, wherein the pattern shape information is information of an image obtained by irradiating the pattern with the charged particle beam, and the edge position detector uses the obtained image to detect the edge position of the pattern.

16. The charged particle beam apparatus according to claim 11, wherein the pattern shape information is design information of the pattern, and the edge position detector uses the design information to detect the edge position of the pattern.

17. A charged particle beam irradiation method comprising:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position so as to irradiate a plurality of serial pixels on the surface of the specimen to be scanned, while preventing the last pixel of the plurality of serial pixels from being disposed adjacent to the first pixel of serial pixels to be next irradiated with the charged particle beam; and irradiating the irradiation position corresponding to the outputted irradiation position information signal with the charged particle beam.

18. The charged particle beam irradiation method according to claim 10, wherein the irradiation position information for the plurality of serial pixels are outputted at random.

19. A method of manufacturing a semiconductor device comprising using a charged particle beam irradiation method, said charged particle beam irradiation method including:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position of the charged particle beam in the surface of the specimen to be scanned by the charged particle beam, while avoiding successive designation of irradiation positions in the irradiation region which are adjacent to each other; and irradiating the irradiation position corresponding to the outputted irradiation position information signal with the charged particle beam.

20. A method of manufacturing a semiconductor device comprising using a charged particle beam irradiation method, said charged particle beam irradiation method including:

detecting an edge position of a pattern formed on a surface of a specimen from shape information of the pattern;

setting an irradiation region which is a region to be irradiated with a charged particle beam to an edge of the pattern and a region on the surface of the specimen in the vicinity of the edge;

successively outputting an irradiation position information signal designating an irradiation position so as to irradiate a plurality of serial pixels on the surface of the specimen to be scanned, while preventing the last pixel of the plurality of serial pixels from being disposed adjacent to the first pixel of serial pixels to be next irradiated with the charged particle beam; and irradiating the irradiation position corresponding to the outputted irradiation position information signal with the charged particle beam.

* * * * *